United States Patent
Sawada (10) Patent No.: US 11,012,068 B2
(45) Date of Patent: May 18, 2021

(54) CAPACITIVE SENSOR APPARATUS

(71) Applicant: PANASONIC INTELLECTUAL PROPERTY MANAGEMENT CO., LTD., Osaka (JP)

(72) Inventor: Takateru Sawada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 97 days.

(21) Appl. No.: 16/272,489

(22) Filed: Feb. 11, 2019

(65) Prior Publication Data

US 2019/0267993 A1    Aug. 29, 2019

(30) Foreign Application Priority Data

Feb. 23, 2018 (JP) .............................. JP2018-030363
Sep. 25, 2018 (JP) .............................. JP2018-178972

(51) Int. Cl.
*H03K 17/955* (2006.01)
*G01V 3/08* (2006.01)
*E05F 15/73* (2015.01)

(52) U.S. Cl.
CPC ............. *H03K 17/955* (2013.01); *G01V 3/08* (2013.01); *E05F 15/73* (2015.01)

(58) Field of Classification Search
CPC .............................. H03K 17/955; G01V 3/08
See application file for complete search history.

(56) References Cited

U.S. PATENT DOCUMENTS

| | | | | |
|---|---|---|---|---|
| 4,090,092 A | * | 5/1978 | Serrano | H03K 17/962 200/600 |
| 4,380,040 A | * | 4/1983 | Posset | H03K 17/962 200/600 |
| 10,120,519 B2 | * | 11/2018 | Sawada | H01H 36/00 |
| 2011/0156724 A1 | * | 6/2011 | Bokma | G01R 27/2605 324/658 |
| 2014/0267039 A1 | * | 9/2014 | Curtis | G06F 3/0362 345/161 |
| 2015/0049057 A1 | * | 2/2015 | Citta | G06F 3/044 345/174 |
| 2015/0177298 A1 | * | 6/2015 | Sugiura | G01R 27/2605 324/658 |
| 2015/0268790 A1 | * | 9/2015 | Meyer | G06F 3/0362 345/174 |

FOREIGN PATENT DOCUMENTS

JP     2013-113626     6/2013

* cited by examiner

*Primary Examiner* — Paresh Patel
(74) *Attorney, Agent, or Firm* — Greenblum & Bernstein, P.L.C.

(57) ABSTRACT

The capacitive sensor apparatus includes: a sensor element disposed on the first surface of the mounting member; and a floating conductor that is disposed on the second surface of the mounting member and is electrically conductive, the floating conductor being electrically disconnected from the sensor element. The sensor element includes: a first electrode; and a second electrode in a shape of a ring surrounding an outer periphery of the first electrode and being electrically disconnected from the first electrode. The floating conductor overlaps at least the first electrode in a projection view seen from the first surface.

6 Claims, 10 Drawing Sheets

CAPACITIVE SENSOR APPARATUS

CROSS REFERENCE TO RELATED APPLICATIONS

The present application is based on and claims priority of Japanese Patent Application No. 2018-030363 filed on Feb. 23, 2018 and Japanese Patent Application No. 2018-178972 filed on Sep. 25, 2018.

BACKGROUND

1. Technical Field

The present disclosure relates to capacitive sensor apparatuses.

2. Description of the Related Art

As a conventional capacitive sensor apparatus, the capacitive sensor apparatus disclosed in Japanese Unexamined Patent Application Publication No. 2013-113626 (hereinafter, Patent Literature 1 (PTL 1)) has been known, for example.

PTL 1 discloses a capacitive sensor apparatus (operational input detection apparatus) including a sensor element and a controller that is electrically connected to the sensor element. The sensor element includes a first electrode and a second electrode, and the second electrode is spaced apart from the first electrode and linearly surrounds the first electrode. The capacitive sensor apparatus is configured such that the capacitance of the first and second electrodes changes, when an operation body, such as a user's finger, comes into contact with the sensor element. A controller detects the state of the contact operation based on the change in capacitance by a predetermined detection process flow.

SUMMARY

The capacitive sensor apparatus according to PTL 1 can be improved upon. In view of this, the present disclosure provides a capacitive sensor apparatus capable of improving upon the above related art.

In order to achieve this, a capacitive sensor apparatus according to one aspect of the present disclosure is attached to a mounting member having a first surface and a second surface opposite the first surface, and configured to receive a contact operation toward the second surface performed by an operation body. The capacitive sensor apparatus includes: a sensor element disposed on the first surface of the mounting member; and a floating conductor that is disposed on the second surface of the mounting member and is electrically conductive, the floating conductor being electrically disconnected from the sensor element. The sensor element includes: a first electrode; and a second electrode in a shape of a ring surrounding an outer periphery of the first electrode and being electrically disconnected from the first electrode, and the floating conductor overlaps at least the first electrode in a projection view seen from the first surface.

A capacitive sensor according to one aspect of the present disclosure is capable of improving upon the above related art.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT (Underlying Knowledge Forming the Basis of the Disclosure)

The present inventor has found the following matters arose in the capacitive sensor apparatus described in the Description of the Related Art. In the capacitive sensor apparatus of PTL 1, the capacitance of the sensor element increases or decreases depending on the actual area of the sensor element that comes into contact with the operation body (finger). Especially when the area of the sensor element that comes into contact with the operation body is small, the capacitance generated between the sensor element and the operation body by the contact operation is small, and thus it has been difficult to correctly detect the state of the contact operation.

The present disclosure is conceived in view of the above, and the present disclosure improves the detection accuracy of the contact operation.

The following describes in detail an embodiment of the present disclosure with reference to the drawings. The following descriptions of the embodiment are substantially mere examples, and do not intend to limit the present disclosure, products made by applying the present disclosure, or its applications.

Figure 1:
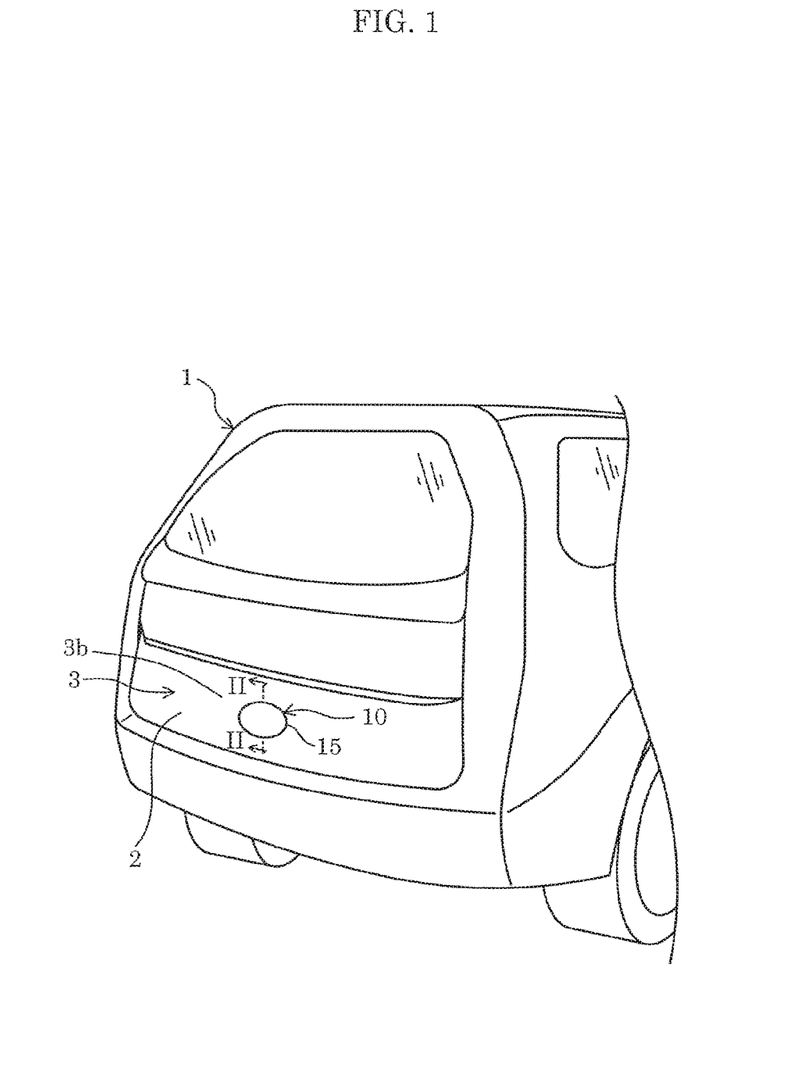
FIG. 1 is a perspective view illustrating a state where a capacitive sensor apparatus according to an embodiment is attached to a rear garnish of a trunk door of a motor vehicle.
Figure 2:
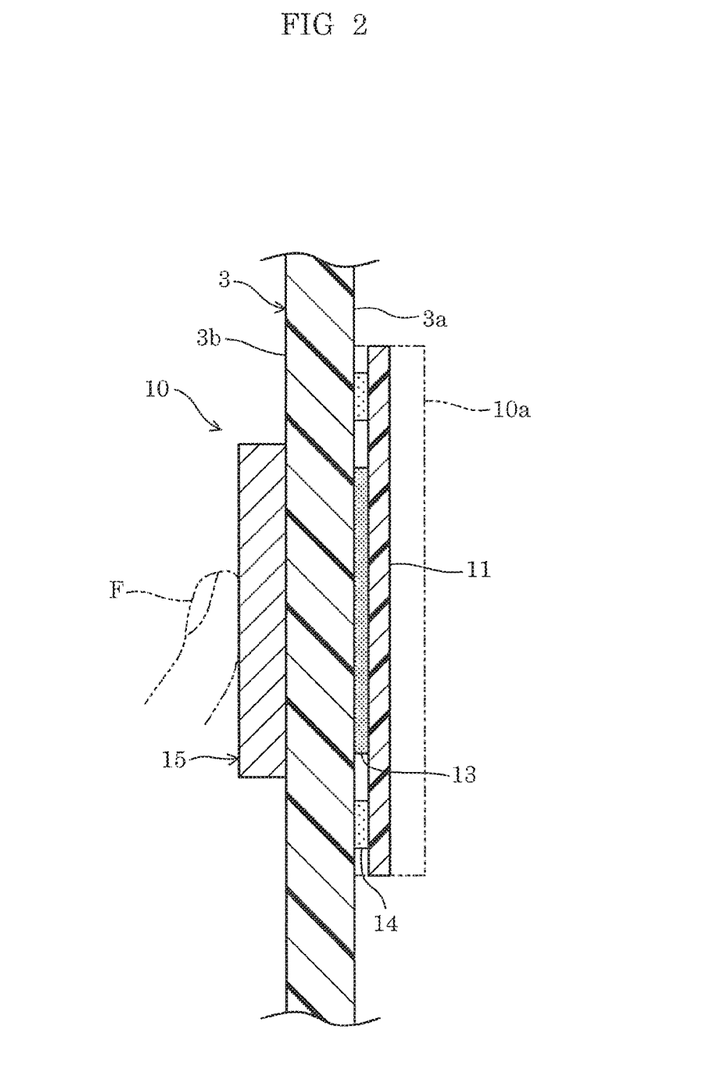
FIG. 2 is a cross-sectional view taken along the line II-II in FIG. 1.

FIG. 1 illustrates a state where capacitive sensor apparatus 10 according to an embodiment is attached to rear garnish 3 (mounting member) of trunk door 2 at the back of motor vehicle 1. As illustrated in FIG. 2, rear garnish 3 is made of a substantially plate-like resin material, for example. Rear garnish 3 has inner surface 3a (first surface) that faces toward the passenger compartment of motor vehicle 1 and outer surface 3b (second surface) that is opposite inner surface 3a.

In the present embodiment, capacitive sensor apparatus 10 is capable of receiving a proximity operation and a contact operation toward outer surface 3b of rear garnish 3 performed by operation body F (see FIG. 2), which is a hand or a finger of a human body for example. The proximity operation or the contact operation brings an operation body into proximity with or into contact with floating conductor 15, which will be described later. In other words, capacitive sensor apparatus 10 is configured to function as a rear gate switch of motor vehicle 1.

(Substrate)

As illustrated in FIG. 2, capacitive sensor apparatus 10 includes substrate 11. Substrate 11 is disposed above inner surface 3a of rear garnish 3 with substrate 11 being attached to apparatus main body 10a of capacitive sensor apparatus 10.

(Sensor Element)

Figure 3:
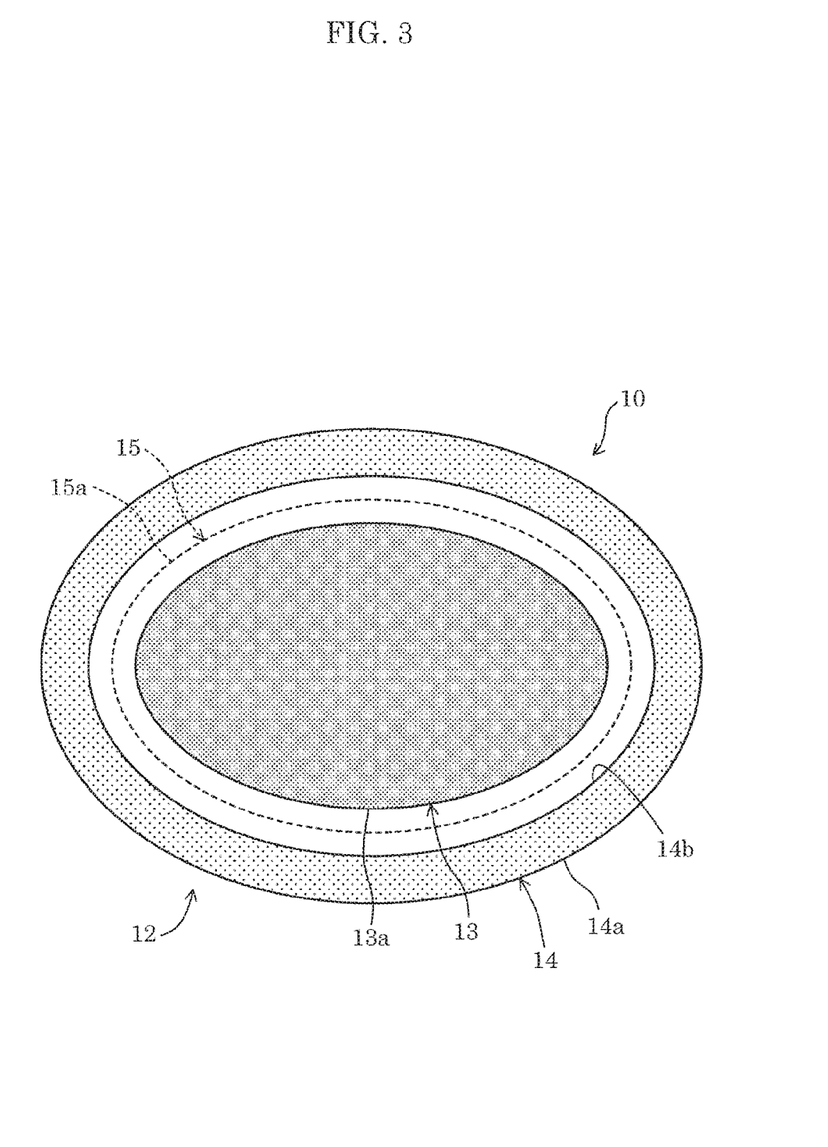
FIG. 3 is a projection view seen from the inner surface of the rear garnish and schematically illustrating the physical relationship of a sensor element and a floating conductor.

As illustrated in FIG. 3, capacitive sensor apparatus 10 includes sensor element 12. Sensor element 12 is configured as sensor electrodes of a self capacitance type. Sensor element 12 includes a conductive metal or conductive resin disposed on substrate 11, for example.

Figure 4:
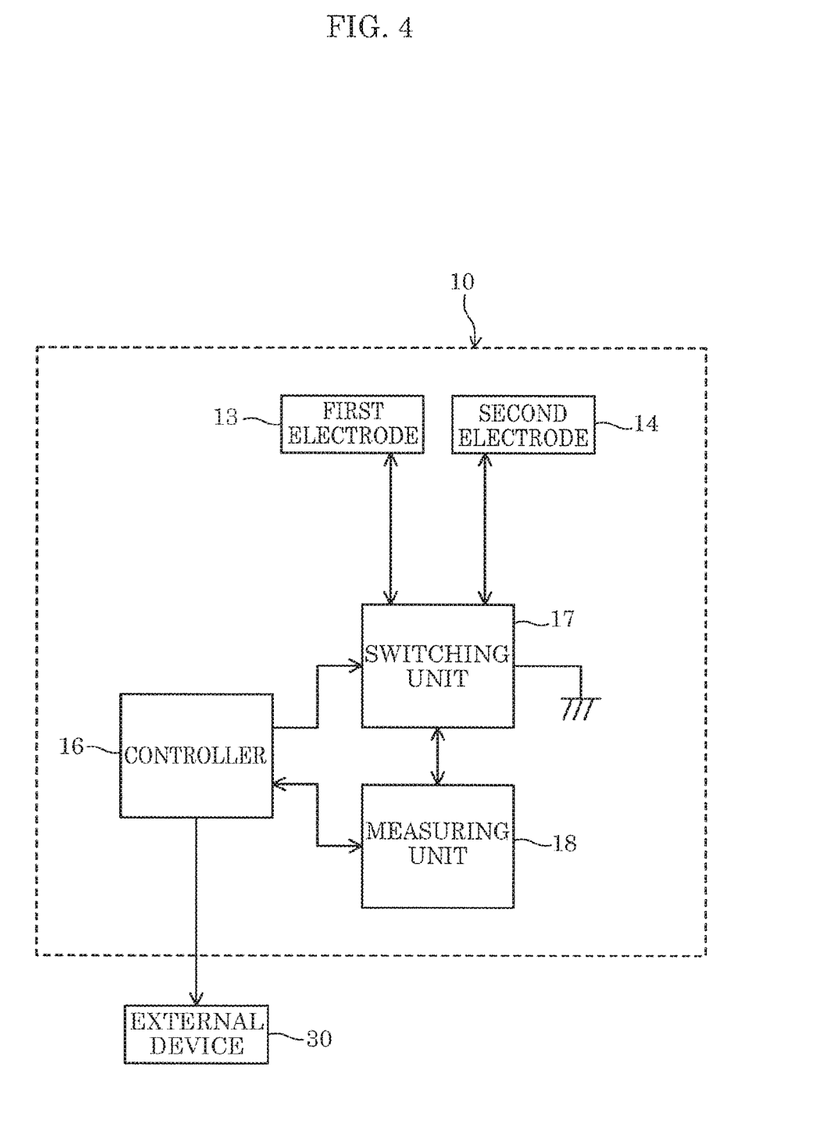
FIG. 4 is a block diagram illustrating a function configuration of the capacitive sensor apparatus according to the embodiment.

Sensor element 12 includes first electrode 13 and second electrode 14. As illustrated in FIG. 4, first electrode 13 and second electrode 14 are electrically disconnected from each other.

As illustrated in FIG. 3, first electrode 13 is in a shape of an oval. Second electrode 14 is in a shape of an oval ring surrounding the outer periphery of first electrode 13. Second electrode 14 is disposed such that inner periphery 14b is spaced apart from outer periphery 13a of first electrode 13 in the radial direction. Note that in FIGS. 2 and 3, first electrode 13 and second electrode 14 are hatched with dots to emphasize first electrode 13 and second electrode 14.

(Floating Conductor)

As illustrated in FIGS. 1 to 3, capacitive sensor apparatus 10 includes floating conductor 15. Floating conductor 15 is electrically conductive. Floating conductor 15 is made of, for example, a metal plate, and is attached to outer surface 3b of rear garnish 3 with screws (not illustrated), etc. Floating conductor 15 is electrically disconnected from first electrode 13 and second electrode 14. Floating conductor 15 is also electrically disconnected from a ground, such as the body of motor vehicle 1. Thus, floating conductor 15 is in an insulated state in which floating conductor 15 is electrically disconnected from any of the conductors in motor vehicle 1.

As illustrated in FIG. 3, floating conductor 15 overlaps at least first electrode 13 in a projection view seen from inner surface 3a of rear garnish 3. Floating conductor 15 is formed in a size that enlarges the effective area of capacitance detection of the user's finger (operation body F). Specifically, floating conductor 15 has a surface area larger than the surface area of operation body F (see FIG. 2), for example. Moreover, floating conductor 15 is shaped such that outer periphery 15a is positioned between outer periphery 13a of first electrode 13 and inner periphery 14b of second electrode 14 in the projection view. Note that the configuration of floating conductor 15 is not limited to the above-mentioned configuration in which the surface area of floating conductor 15 is larger than the surface area of operation body F. Floating conductor 15 may have a configuration in which the surface area of floating conductor 15 is larger than an area that comes into contact with operation body F in the projection view, for example.

(Controller, etc.)

As illustrated in FIG. 4, capacitive sensor apparatus 10 includes controller 16, switching unit 17, and measuring unit 18.

Controller 16 is electrically connected to first electrode 13 and second electrode 14. Controller 16 is also electrically connected to external device 30. Controller 16 stores, for example, information on conditions of first to third measurements, first to sixth thresholds TH1 to TH6, and operation equations for obtaining calculated values, which will be described later in the description of processing operation (see FIG. 5). Note that in the present embodiment, examples of external device 30 include opening and closing device and locking device that are disposed in or on trunk door 2 of motor vehicle 1. Opening and closing device and locking device are not illustrated in the drawings.

Controller 16 detects change in the capacitance of sensor element 12 (first and second electrodes 13 and 14) when operation body F is brought into proximity with or into contact with floating conductor 15, and determines whether the operation performed by operation body F is the proximity operation or the contact operation based on the amounts of change. Controller 16 may be configured as a processor that executes a predetermined program and a memory that stores a predetermined program, or may be configured as a dedicated circuit, for example.

Switching unit 17 is connected to the potential of the ground with switching unit 17 being electrically connected to controller 16 and measuring unit 18. Switching unit 17 is capable of switching between electric connection states (an ON state/OFF state) of each of the first and second electrodes 13 and 14 with respect to controller 16 in response to the signal from controller 16. Switching unit 17 is capable of connecting each of first and second electrodes 13 and 14 to the potential of the ground in response to the signal from controller 16. Switching unit 17 is configured as a switching device or a switching circuit including a plurality of switches, for example.

Measuring unit 18 is electrically connected to controller 16. Measuring unit 18 is capable of measuring, in response to the signal from controller 16, the capacitance generated by each of first and second electrodes 13 and 14 due to a conductor positioned in the proximity of first and second electrodes 13 and 14, and outputting the measured value to controller 16. Measuring unit 18 may be configured as a processor that executes a predetermined program and a memory that stores a predetermined program, or may be configured as a dedicated circuit, for example.

(Processing Operations by Controller)

Next, a series of processing operations performed by controller 16 is described with reference to FIG. 5. Note that the processing operations illustrated in FIG. 5 are executed repeatedly by executing a main routine by controller 16.

Figure 5:
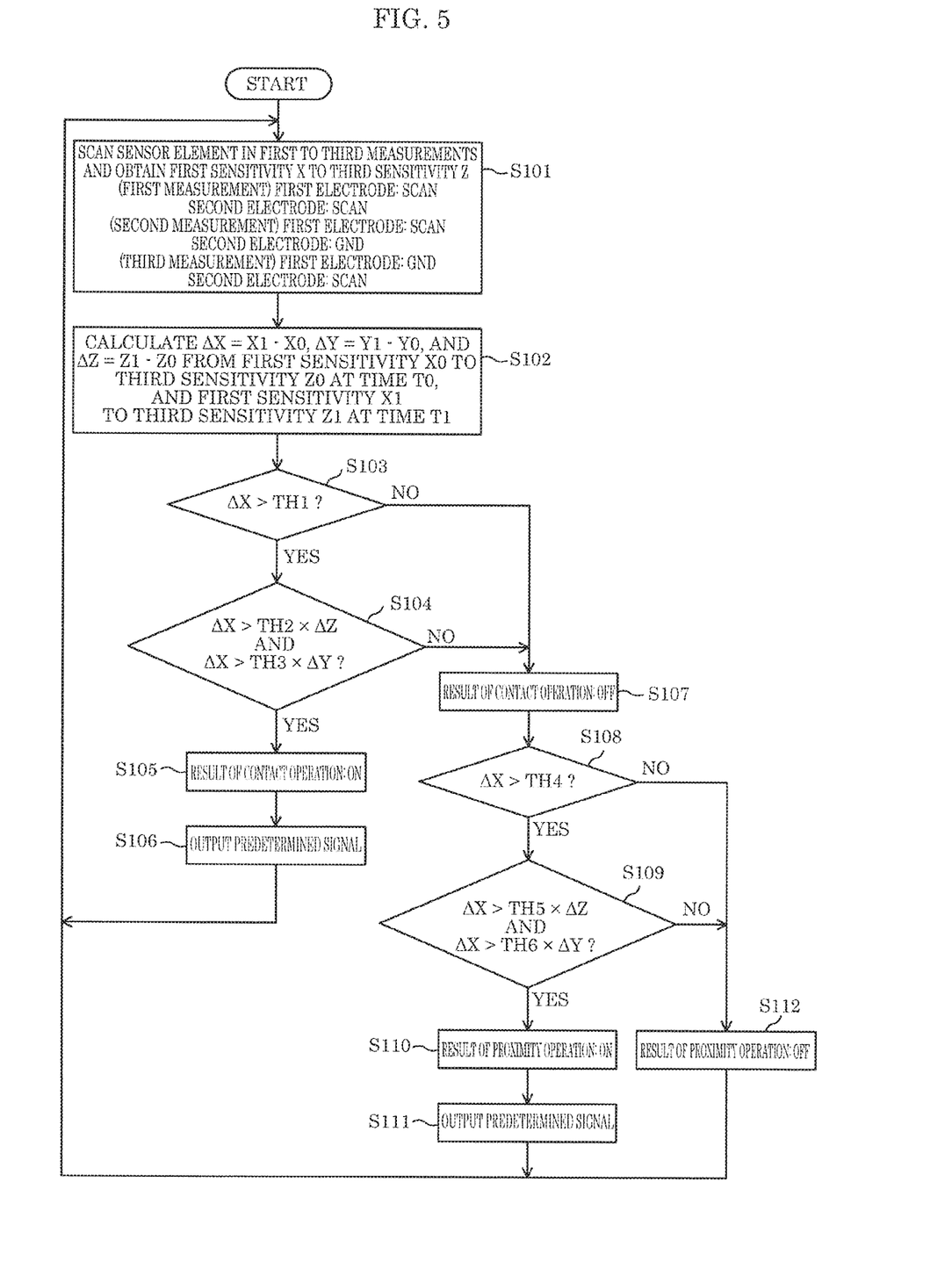
FIG. 5 is a flowchart illustrating a processing operation of a controller.

As illustrated in FIG. 5, in first Step S101, controller 16 scans sensor element 12. In other words, controller 16 measures change in capacitance of sensor element 12 in first to third measurements, and obtains first sensitivity X to third sensitivity Z corresponding to the capacitance of sensor element 12. The process subsequently proceeds to Step S102.

Specifically, in the first measurement, switching unit 17 electrically connects controller 16 to first and second electrodes 13 and 14. In this connection state, controller 16 applies a driving voltage to first and second electrodes 13 and 14, and measuring unit 18 measures capacitance of first and second electrodes 13 and 14. Controller 16 obtains first sensitivity X (see FIG. 6) corresponding to the measured values of the capacitance of the first and second electrodes 13 and 14.

In the second measurement, switching unit 17 electrically connects controller 16 to the first electrode 13, and connects second electrode 14 to the potential of the ground (hereinafter referred to as GND potential). In this connection state, controller 16 applies the driving voltage to first electrode 13, and measuring unit 18 measures the capacitance of first electrode 13. Controller 16 obtains second sensitivity Y (see FIG. 6) corresponding to the measured value of the capacitance of first electrode 13.

In the third measurement, switching unit 17 electrically connects controller 16 to the second electrode 14, and connects first electrode 13 to the GND potential. In this connection state, controller 16 applies the driving voltage to second electrode 14, and measuring unit 18 measures the capacitance of second electrode 14. Controller 16 obtains third sensitivity Z (see FIG. 6) corresponding to the measured value of the capacitance of second electrode 14.

Here, controller 16 temporarily stores first sensitivity X to third sensitivity Z in a memory (not illustrated). Note that, since the processing operation illustrated in FIG. 5 is repeated by executing the main routine, processing in Step S101, namely, switching among the first measurement, the second measurement, and the third measurement and obtaining first sensitivity X to third sensitivity Z, is repeatedly performed at a predetermined interval (for example, interval of 50 msec). First sensitivity X to third sensitivity Z in the past are accumulated and stored in the memory at any time. In other words, even when capacitive sensor apparatus 10 is in a state of non operation, i.e., a state of not being operated, Step S101 is repeated and the first sensitivity X to third sensitivity Z are accumulated and stored. The values of first sensitivity X to third sensitivity Z are sequentially eliminated when their storage periods have elapsed a predetermined storage period.

Next, in Step S102, controller 16 uses first sensitivity X1 to third sensitivity Z1 at current time t1, and first sensitivity X0 to third sensitivity Z0 at a time in the past that is a predetermined period (for example, 500 msec before time t1, and calculates (i) first calculated value ΔX, which is the difference between X1 and X0 (=X1−X0), (ii) second calculated value ΔY, which is the difference between Y1 and Y0 (=Y1−Y0), and (iii) third calculated value ΔZ, which is the difference between Z1 and Z0 (=Z1−Z0). The process subsequently proceeds to Step S103. Note that the time interval between time t0 and time t1 is not limited to 500 msec, and may be 1000 msec or less, for example.

In Step S103, controller 16 compares first calculated value ΔX with a predetermined first threshold TH1. When first calculated value ΔX is larger than first threshold TH1, which is Yes, the process proceeds to Step S104. Alternatively, when first calculated value ΔX is smaller than first threshold TH1, which is No, the process proceeds to Step S107.

In Step S104, controller 16 compares first calculated value ΔX with a fourth calculated value (TH2×ΔZ) obtained by multiplying a predetermined second threshold TH2 by third calculated value ΔZ. Furthermore, controller 16 compares first calculated value ΔX with a fifth calculated value (TH3×ΔY) obtained by multiplying a predetermined third threshold TH3 by second calculated value ΔY. When first calculated value ΔX is larger than the fourth calculated value (TH2×ΔZ) and larger than the fifth calculated value (TH3×ΔY), which is Yes, the process proceeds to Step S105. Alternatively, when first calculated value ΔX is smaller than one of or both of the fourth calculated value (TH2×ΔZ) and the fifth calculated value (TH3×ΔY), which is No, the process proceeds to Step S107.

In Step S105, controller 16 determines that the contact operation that brings operation body F into contact with floating conductor 15 has been performed. In other words, controller 16 determines that the result of the contact operation is ON. The process subsequently proceeds to Step S106.

In Step S106, controller 16 outputs, to external device 30 illustrated in FIG. 4, a predetermined signal indicating that the result of determination of the contact operation is ON. This activates external device 30 to perform the opening and closing action of trunk door 2, for example. The process subsequently proceeds to Step S101.

In contrast, in Step S107, controller 16 determines that operation body F is not in contact with floating conductor 15, and determines that the result of the contact operation is OFF. The process subsequently proceeds to Step S108.

In Step S108, controller 16 compares first calculated value ΔX with predetermined fourth threshold TH4. When first calculated value ΔX is larger than fourth threshold TH4, which is Yes, the process proceeds to Step S109. Alternatively, when first calculated value ΔX is smaller than fourth threshold TH4, which is No, the process proceeds to Step S112.

In Step S109, controller 16 compares first calculated value ΔX with a sixth calculated value (TH5×ΔZ) obtained by multiplying predetermined fifth threshold TH5 by third calculated value ΔZ. Moreover, controller 16 compares first calculated value ΔX with a seventh threshold value (TH6×ΔY) obtained by multiplying predetermined sixth threshold TH6 by second calculated value ΔY. When first calculated value ΔX is larger than sixth calculated value (TH5×ΔZ) and larger than the seventh calculated value (TH6×ΔY), which is Yes, the process proceeds to Step S110. On the other hand, when first calculated value ΔX is smaller than one of or both of the sixth calculated value (TH5×ΔZ) and the seventh calculated value (TH6×ΔY), which is No, the process proceeds to Step S112.

In Step S110, controller 16 determines that the proximity operation that brings operation body F into proximity with floating conductor 15 has been performed. In other words, controller 16 determines that the result of the proximity operation is ON. The process subsequently proceeds to Step S111.

In Step S111, controller 16 outputs, to external device 30 illustrated in FIG. 4, a predetermined signal indicating the result of the determination of the proximity operation is ON. This activates external device 30 to unlock trunk door 2, for example. The process subsequently returns to Step S101.

In contrast, in Step S112, controller 16 determines that operation body F is not in contact with floating conductor 15, and determines that the result of the proximity operation is OFF. The process subsequently returns to Step S101.

Figure 6:
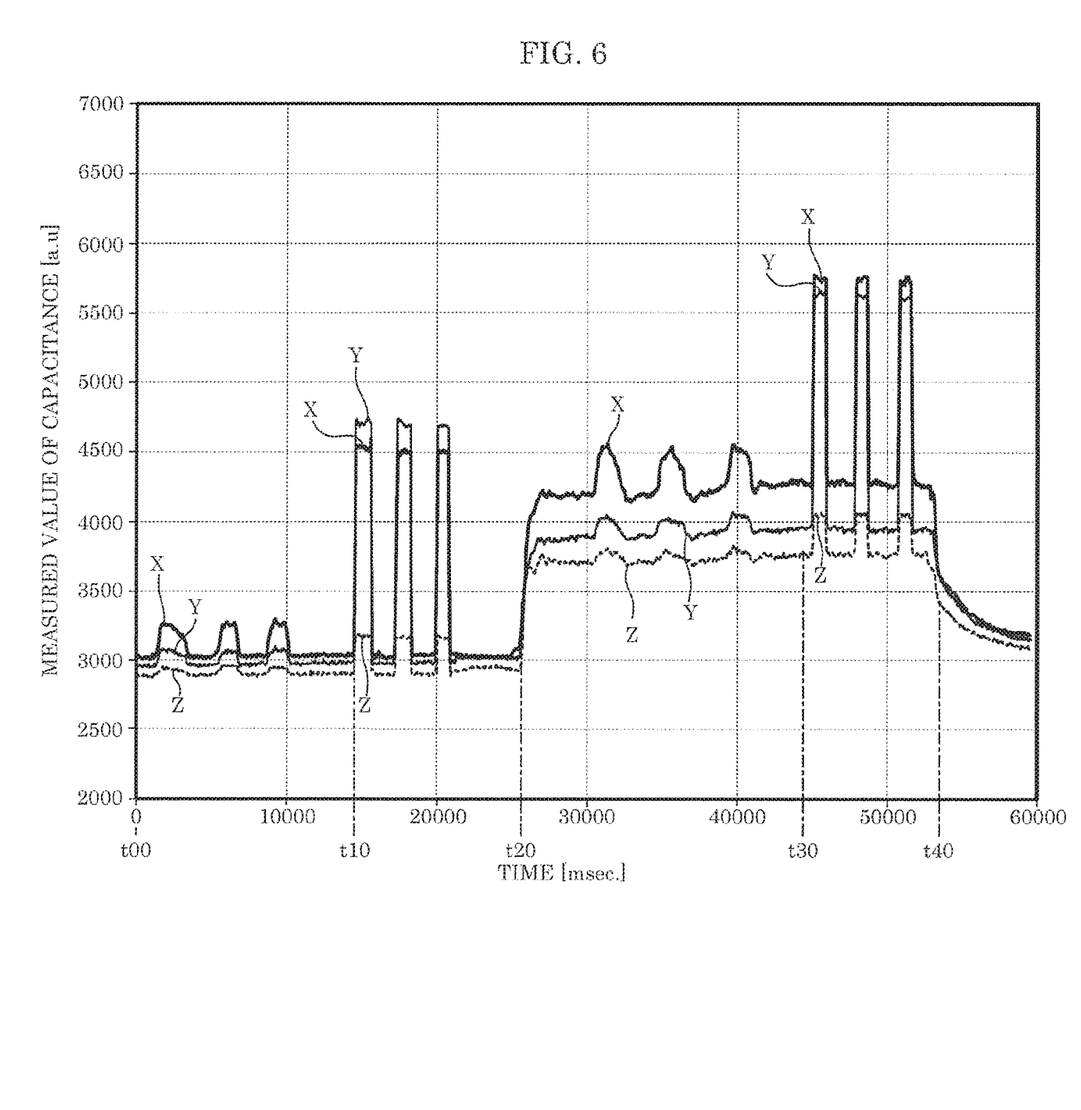
FIG. 6 is a graph showing changes in the measured values of the capacitance of the sensor element.
Figure 7:
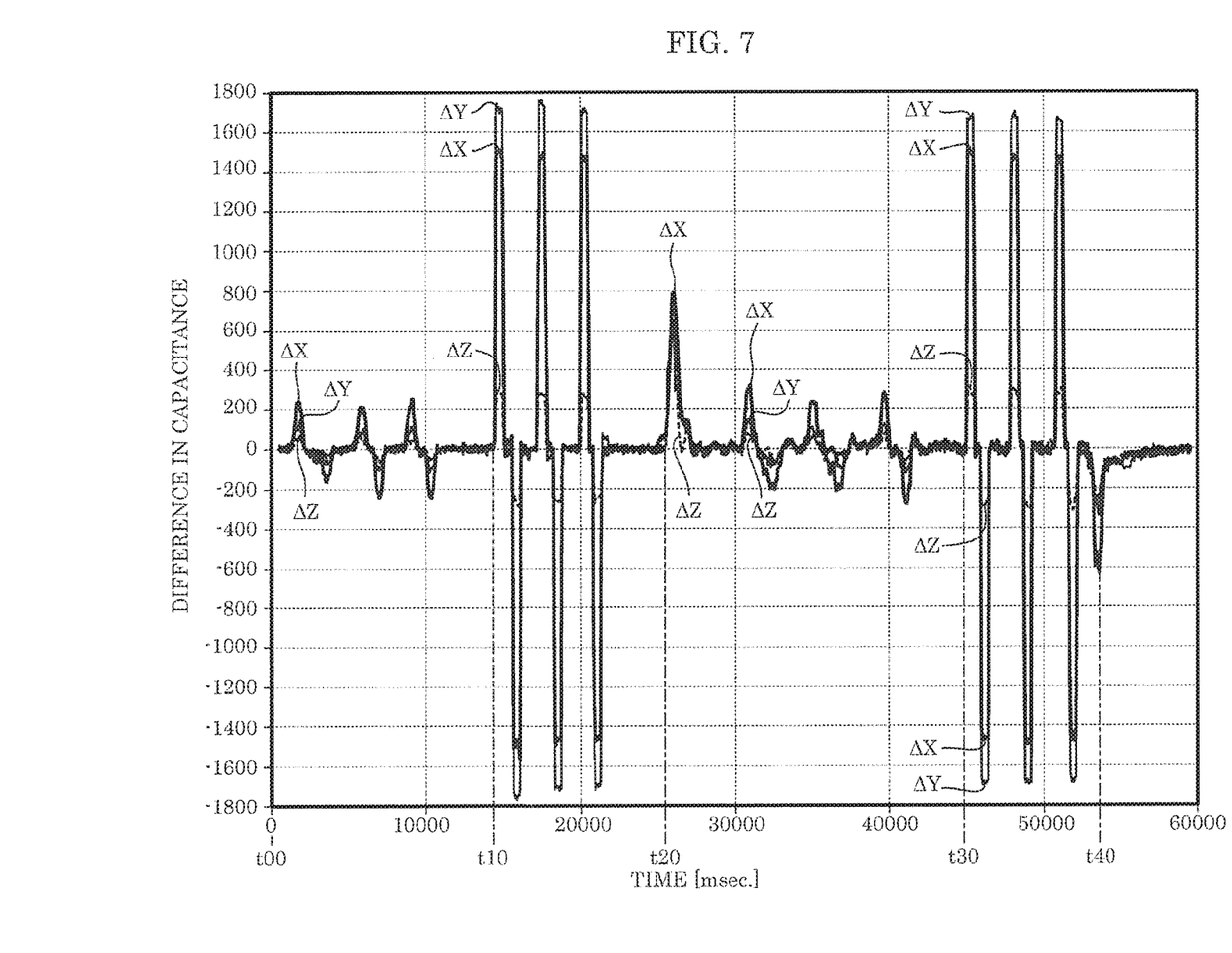
FIG. 7 is a graph showing changes in the difference in capacitance of the sensor element.

The following describes, with reference to FIG. 6 and FIG. 7, the reasons why the use of the first calculated value ΔX to third calculated value ΔZ makes it possible to accurately determine the operation state (proximity operation or contact operation).

FIG. 6 and FIG. 7 are graphs showing an example of the measured results of the first sensitivity X to third sensitivity Z obtained by performing the first to third measurements. In FIG. 6, the horizontal axis indicates time, and the vertical axis indicates the measured values of capacitance (values of first sensitivity X to third sensitivity Z are indicated in an arbitrary unit (a.u.) proportional to capacitance). In FIG. 7, the horizontal axis indicates time, and the vertical axis indicates the difference in capacitance.

In FIG. 6 and FIG. 7, in the time period from time t00 to time t10, the result of measurement when a hand (operation body F) is brought into contact with floating conductor 15 three times in a state (dry state) where no water is on floating conductor 15 is shown. In the time period from time t10 to time t20, the result of measurement when the hand is brought into contact with floating conductor 15 three times in the dry state is shown. In the time period from time t20 to time t30, the result of measurement when the hand is brought into proximity with floating conductor 15 three times when water is falling on floating conductor 15 is shown. In the time period from time t30 to time t40, the result of measurement when the hand is brought into contact with floating conductor 15 three times when water is falling on floating conductor 15 is shown.

When a user brings his or her hand into proximity or into contact with floating conductor 15, the values of first sensitivity X to third sensitivity Z increase temporarily as shown in FIG. 6. Moreover, when water falls on floating conductor 15 from time t20, the values of the first sensitivity X to third sensitivity Z also increase. When the user brings his or her hand into proximity with or into contact with floating conductor 15 when water is falling on floating conductor 15, as shown in the results of the time period from time t20 to time t40, each of the values of the first sensitivity X to third sensitivity Z which has increased due to water falling thereon further increases in response to the proximity operation or contact operation. Note that, when no water falls on floating conductor 15 from time t40, the values of the first sensitivity X to third sensitivity Z decrease toward their respective values at time t00.

Next, as understood from FIG. 7 in which the vertical axis indicates the difference in capacitance, the waveform representing the measured result when the user brings his or her hand into proximity with or into contact with floating conductor 15 during the time period from time t00 to time t20, and the waveform representing the measured result when the user brings his or her hand into proximity with or into contact with floating conductor 15 during the time period from time t20 to time t40 have a similar tendency. This is because the difference in capacitance corresponds to the values obtained by time differentiating the measured values of capacitance in FIG. 6. Thus, by calculating the difference in capacitance, the waveform of the proximity operation or the contact operation can be made the same whether water is falling or not.

FIG. 7 shows that when the user brings his or her hand into contact with floating conductor 15 during the time periods from time t10 to time t20 and from time t30 to t40, the difference in capacitance (first calculated values ΔX) abruptly increases. Accordingly, as described in step S103 in FIG. 5, for example, when first threshold TH1 is set to 1400 (arbitrary unit) and first calculated value ΔX is over 1400 in FIG. 7 (Yes in Step S103), it can be determined that the contact operation may have been performed. When first calculated value ΔX is 1400 or less (No in Step S103), it can be determined that no contact operation has been performed.

Here, the case where it cannot be necessarily determined that contact operation has been performed even when the result is Yes in Step S103 is described.

The difference in capacitance at time t20 in FIG. 7 is the behavior of the difference in capacitance when water falls on floating conductor 15. Here, since first calculated value ΔX is increased only up to approximately 800, the value does not reach first threshold TH1 (=1400). Therefore, in the example in FIG. 7, the state where only water is on can be eliminated in the determination in Step S103. However, when the amount of water is large, or water includes an electrolyte, such as a snow-melting agent, the measured value of capacitance may increase rapidly, and the difference in capacitance may become large, and first calculated value ΔX may exceed first threshold TH1 (=1400). In such a case, the influence of water cannot be eliminated by the determination in Step S103 alone.

In view of this, determination in Step S104 is added to eliminate the influence of water. The following describes elimination of the influence of water in detail.

When heavy rain or water including an electrolyte falls on capacitive sensor apparatus 10 illustrated in FIG. 1, water is more likely to flows along and around floating conductor 15 illustrated in FIG. 2 than to the other parts. As a result, the influence of water is large on the capacitance between floating conductor 15 and second electrode 14. Thus, third calculated value ΔZ obtained in the third measurement becomes large. As compared with this, although some water falls on the surface of floating conductor 15, the percentage of the area of the surface of floating conductor 15 that comes into contact with water is less than the percentage of the area of the surface around floating conductor 15 that comes into contact with water. Therefore, second calculated value ΔY obtained in the second measurement becomes smaller than third calculated value ΔZ.

Accordingly, since third calculated value ΔZ becomes large when a large amount of water or water including an electrolyte falls on floating conductor 15, first calculated value ΔX is equal to or less than fourth calculated value (TH2×ΔZ). Although second calculated value ΔY becomes smaller than third calculated value ΔZ, the area of first electrode 13 is larger than the area of second electrode 14, and thus second calculated value ΔY does not decrease sharply. Therefore, first calculated value ΔX tends to be equal to or less than fifth calculated value (TH3×ΔY).

Thus, when a large amount of water or water including an electrolyte falls on floating conductor 15 in Step S104, at least one of (i) first calculated value ΔX being equal to or less than fourth calculated value (TH2×ΔZ) and (ii) first calculated value ΔX being equal to or less than fifth calculated value (TH3×ΔY) is established. This yields the result of No in Step S104, and the influence of water can be sufficiently eliminated. In view of the measured result in FIG. 7, the value of second threshold TH2 may be set to 5 (arbitrary unit), for example, and the value of third threshold TH3 may be set to 0.7 (arbitrary unit), for example.

Next, the case where the user's hand is not brought into contact with but into proximity with floating conductor 15 is described. First, in the time periods from time t00 to time t10 and from time t20 to time t30 in FIG. 7, the difference in the capacitance (first calculated values ΔX) abruptly increases, though not to the extent of the increase in the contact operation. Accordingly, as described in Step S108 of FIG. 5, for example, when fourth threshold TH4 is set to 200 (arbitrary unit), and first calculated value ΔX is over 200 in FIG. 7 (Yes in Step S108), it can be determined that the proximity operation may have been performed. When first calculated value ΔX is 200 or less (No in Step S108), it can be determined that no proximity operation has been performed.

Here, the case where it cannot be necessarily determined that proximity operation has been performed even when the result is Yes in Step S108 is described.

At time t20 in FIG. 7, when water falls on floating conductor 15, first calculated value ΔX increases to approximately 800 as described above. Since the value is above fourth threshold TH4 (=200), the influence of water cannot be eliminated in Step S108 to determine that a proximity operation is performed.

In view of the above, determination of Step S109 is added to eliminate the influence of water. The following describes elimination of the influence of water in detail.

When water falls on capacitive sensor apparatus 10, water more likely to flow along and around floating conductor 15 illustrated in FIG. 2 than to the other parts as described above. As a result, the influence of water is large on the capacitance between floating conductor 15 and second electrode 14. Thus, third calculated value ΔZ obtained in the third measurement becomes large. As compared with this, although some water falls on the surface of floating conductor 15, the percentage of the area of the surface of floating conductor 15 that comes into contact with water is less than the percentage of the area of the surface around floating conductor 15 that comes into contact with water. Thus, second calculated value ΔY obtained in the second measurement becomes smaller than third calculated value ΔZ.

Accordingly, since third calculated value ΔZ becomes large when water falls on floating conductor 15, first calculated value ΔX is equal to or less than sixth calculated value (TH5×ΔZ). Although second calculated value ΔY becomes small compared with third calculated value ΔZ, the area of first electrode 13 is larger than the area of second electrode 14, and thus second calculated value ΔY does not decrease sharply. Thus, first calculated value ΔX tends to be equal to or less than seventh calculated value (TH6×ΔY).

Thus, in Step S109, when water falls on floating conductor 15, at least one of (i) first calculated value ΔX being equal to or less than sixth calculated value (TH5×ΔZ) and (ii) first calculated value ΔX being equal to or less than seventh calculated value (TH6×ΔY) is established. This yields the result of No in Step S109, and the influence of water can be eliminated sufficiently. Note that, in view of the measured result in FIG. 7, the value of fifth threshold TH5 may be set to 3 (arbitrary unit), for example, and the value of sixth threshold TH6 may be set to 1.8 (arbitrary unit), for example.

These operations enable elimination of the influence of the water that falls on floating conductor 15, etc., and thus enable highly accurate determination of the proximity operation or the contact operation.

Effects of Embodiment

In capacitive sensor apparatus 10 according to the embodiment of the present disclosure, when operation body F comes into contact with floating conductor 15, which is the contact operation, the potential of floating conductor 15 becomes the same as the potential of operation body F. Accordingly, the capacitance measured by sensor element 12 increases. Floating conductor 15 is formed such that floating conductor 15 overlaps at least first electrode 13 in the projection view seen from inner surface 3a (first surface) of rear garnish 3. Here, floating conductor 15 has a size that enlarges the effective area for detecting capacitance of operation body F. Thus, when operation body F comes into contact with floating conductor 15, the increase in the capacitance measured by sensor element 12 in the first measurement is the capacitance generated between the area in which floating conductor 15 and sensor element 12 face each other via rear garnish 3 (mounting member). Thus, regardless of the size of the area of floating conductor 15 that comes into contact with operation body F, the increase in the capacitance measured by sensor element 12 is approximately constant. As a result, the presence of floating conductor 15 enables stable detection of the contact operation by operation body F, regardless of the size of the area that comes into contact with operation body F. Thus, capacitive sensor 10 is capable of improving the accuracy of detecting the contact operation. Note that, capacitive sensor apparatus 10 achieves the above-mentioned effects as long as capacitive sensor apparatus 10 is capable of receiving the contact operation performed toward at least outer surface 3b of rear garnish 3.

Moreover, floating conductor 15 has a surface area larger than a surface area of operation body F. Accordingly, when operation body F comes into contact with floating conductor 15, the increase in the capacitance measured by sensor element 12 in the first measurement is the capacitance generated between the surface area of floating conductor 15 which is larger than the area that comes into contact with operation body F and the area of sensor element 12 that faces floating conductor 15 via rear garnish 3. In other words, since floating conductor 15 has a size that enlarges the effective area for detecting capacitance of operation body F, the presence of floating conductor 15 increases the capacitance that is generated by the contact by operation body F between sensor element 12 and operation body F, compared with the case where there is no floating conductor 15. Accordingly, the amount of increase in the capacitance measured by sensor element 12 also increases. Thus, the accuracy of detecting the contact operation further improves.

Moreover, outer periphery 15a of floating conductor 15 is positioned between outer periphery 13a of first electrode 13 and inner periphery 14b of second electrode 14 in the projection view. In other words, floating conductor 15 is formed in a size that floating conductor 15 covers entirely first electrode 13 without overlapping second electrode 14 in the projection view.

Since floating conductor 15 is formed larger than outer periphery 13a of the first electrode 13, approximately the same amount of capacitance is generated between operation body F and sensor element 12 regardless of where on floating conductor 15 operation body F is brought into contact with. Thus, the contact operation can be detected regardless of the positions that come into contact with floating conductor 15.

Moreover, forming floating conductor 15 smaller than inner periphery 14b of second electrode 14 makes it possible to eliminate the influence of water highly accurately when water falls on rear garnish 3 and floating conductor 15. As described above, in the embodiment of the present disclosure, in Step S104 and Step S109, the influence of water is eliminated by comparing first calculated value ΔX and second calculated value ΔY, and comparing first calculated value ΔX and third calculated value ΔZ. This is because the changes in the measured value of capacitance obtained in the second measurement and the third measurement correspond to the independent changes in the measured value of capacitance detected by the respective electrodes. In other words, since first electrode 13 is scanned with second electrode 14 being connected to GND potential in the second measurement, the capacitance do not greatly change even when water is attached near second electrode 14, but the capacitance greatly changes when water is attached near first electrode 13. As a result, highly accurate measurement can be performed for water attached near first electrode 13. Similarly, in the third measurement, highly accurate measurement can be performed for water attached near second electrode 14. Therefore, when water is attached near the first electrode 13, second calculated value ΔY increases, and when water is attached near second electrode 14, third calculated value ΔZ increases. Thus, the influence of the water attached to sensor element 12 can be detected independently by each electrode, and the influence of water can be eliminated with high accuracy. However, if floating conductor 15 is formed larger than inner periphery 14b of second electrode 14, the capacitive coupling of floating conductor 15 and the second electrode 14 would be significant. As a result, even when water is attached near first electrode 13 and attached near second electrode 14, both of second calculated value ΔY and third calculated value ΔZ increase. Thus, it is not distinguishable whether the water is attached near first electrode 13 or second electrode 14, and the accuracy of detecting the presence of water decreases.

For these reasons, in the embodiment of the present disclosure, floating conductor 15 is formed in a size which covers entirely first electrode 13 and does not overlap second electrode 14, and by eliminating the influence of the environment such as water falling on floating conductor 15, an operation state (proximity operation or contact operation) can be determined highly accurately.

Variation 1 of Embodiment

Figure 8:
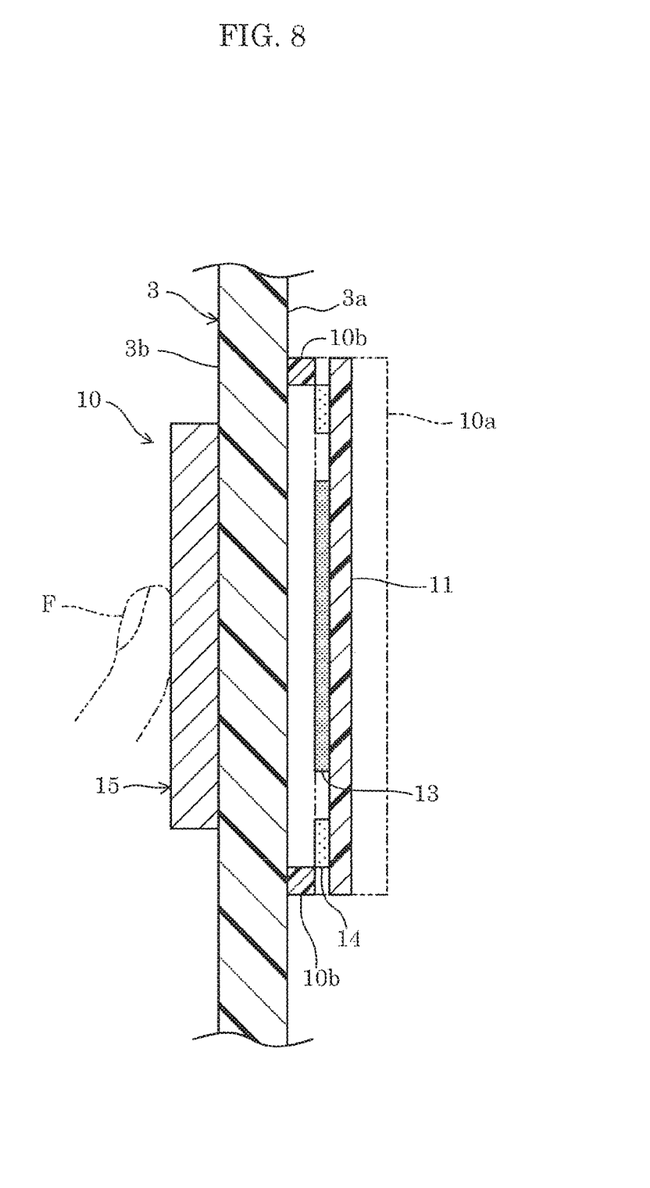
FIG. 8 is a view corresponding to FIG. 2, illustrating a capacitive sensor apparatus according to Variation 1.
Figure 9:
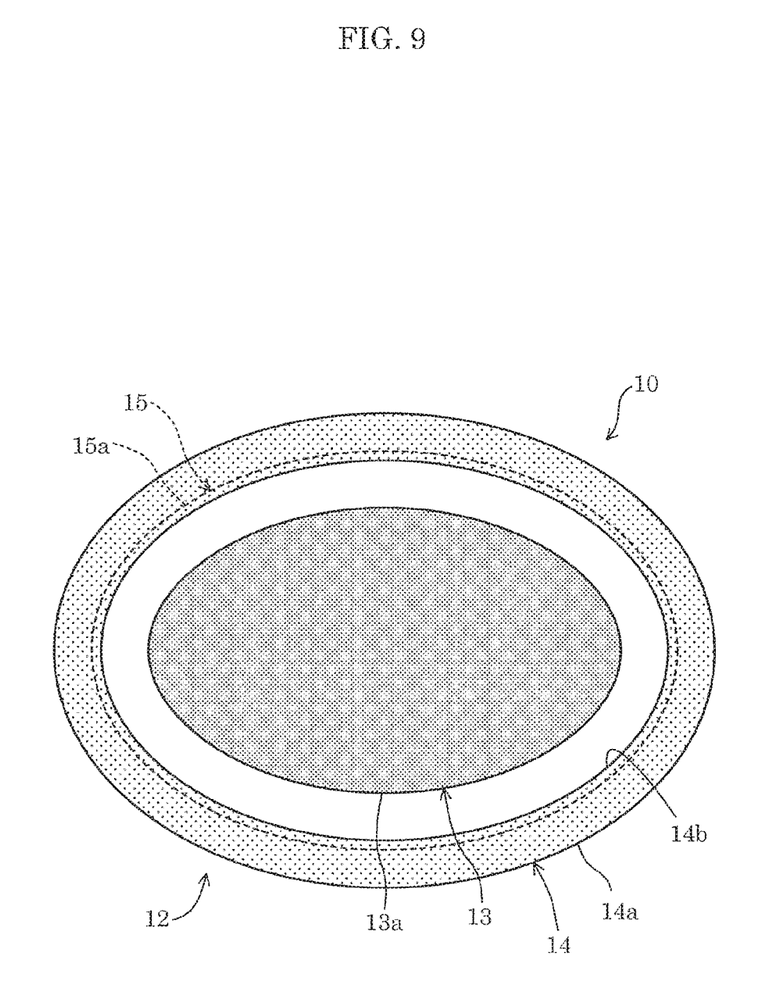
FIG. 9 is a view corresponding to FIG. 3, illustrating the capacitive sensor apparatus according to Variation 1.

In the above embodiment, floating conductor 15 has a configuration in which outer periphery 15a is positioned between outer periphery 13a of first electrode 13 and inner periphery 14b of second electrode 14 in the projection view, but the present disclosure is not limited to this embodiment. For example, in Variation 1, as illustrated in FIG. 8 and FIG. 9, floating conductor 15 may be formed so that outer periphery 15a is positioned more outward than inner periphery 14b of second electrode 14 in the above projection view. Specifically, floating conductor 15 is not limited to the configurations described above as examples as long as floating conductor 15 overlaps at least first electrode 13 in the projection view. Moreover, floating conductor 15 may be shaped such that the outer periphery 15a of floating conductor 15 at least partially overlaps first electrode 13 and partially overlaps second electrode 14 in the projection view. Note that an example of floating conductor 15 partially overlapping second electrode 14 includes a configuration in which floating conductor 15 extends across a part of second electrode 14, and floating conductor 15 partially protrudes from the second electrode 14 in the projection view. Specifically, floating conductor 15 may be shaped in a star such that the vertices of the star protrude from second electrode 14 in the projection view. The above embodiment has described that when floating conductor 15 is formed larger than inner periphery 14b of second electrode 14, the accuracy of detecting the presence of water decreases due to the capacitive coupling between floating conductor 15 and second electrode 14. Regarding this point, since floating conductor 15 is positioned more outward than inner periphery 14b of second electrode 14 in the present embodiment, the influence of capacitive coupling may occur due to the overlap between floating conductor 15 and a part of second electrode 14. However, as illustrated in FIG. 8, holding part 10b is provided on inner surface 3a of rear garnish 3, and a space is provided between inner surface 3a and apparatus main body 10a. Since the capacitive coupling between floating conductor 15 and the second electrode 14 can be suppressed with the space, the accuracy of detecting the presence of water can be kept highly accurate. However, if the outline of floating conductor 15 is larger than second electrode 14, the influence of the capacitive coupling between floating conductor 15 and second electrode 14 is significant even with the space provided by holding part 10b, and thus the accuracy of detecting the presence of water decreases substantially. Therefore, outer periphery 15a of floating conductor 15 may be positioned more inward than outer periphery 14a of second electrode 14 in the projection view. Although in the present embodiment, the capacitive coupling between floating conductor 15 and second electrode 14 is suppressed by providing a space by holding part 10b in the embodiment, thickness of rear garnish 3 may be increased instead of providing holding part 10b, for example, to suppress the capacitive coupling between floating conductor 15 and second electrode 14.

Variation 2 of Embodiment

Figure 10:
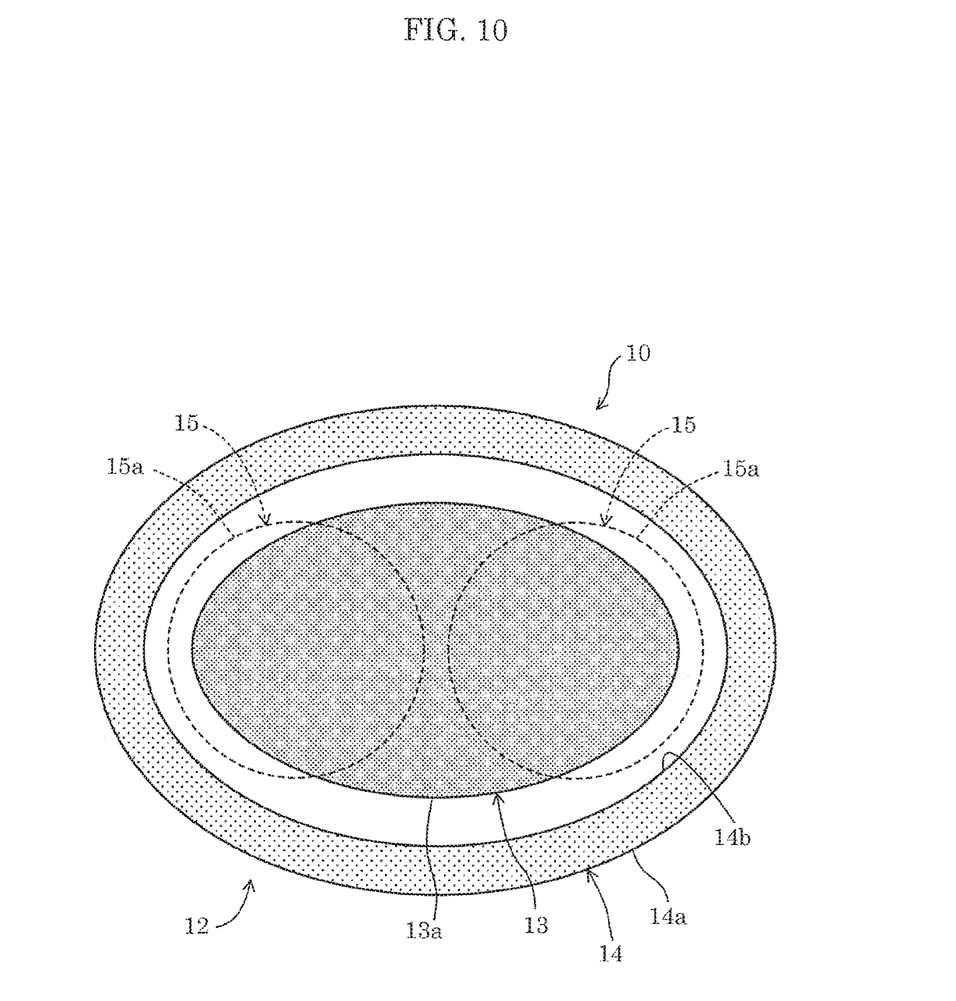
FIG. 10 is a view corresponding to FIG. 3, illustrating a capacitive sensor apparatus according to Variation 2.

The present embodiment has described a configuration in which capacitive sensor apparatus 10 includes only one floating conductor 15, but the present embodiment is not limited to this configuration. In other words, in Variation 2, as illustrated in FIG. 10, capacitive sensor apparatus 10 may include a plurality (two in the example illustrated in the figure) of floating conductors 15. Such Variation 2 also enables capacitive sensor apparatus 10 to achieve similar effects as in the embodiment above, as long as each floating conductor 15 overlaps at least first electrode 13 in the projection view.

Other Embodiments

Although the above embodiment has described the configuration (see FIG. 1) in which capacitive sensor apparatus 10 is attached to rear garnish 3 of trunk door 2 of motor vehicle 1, the present disclosure is not limited to this configuration. Capacitive sensor apparatus 10 may be attached to any part of motor vehicle 1. For example, capacitive sensor apparatus 10 may be attached to a handle (not illustrated) of a door panel which can be opened and closed automatically and is provided on the right or left side of motor vehicle 1.

Although the above embodiment has described the configuration in which capacitive sensor apparatus 10 is attached to a predetermined part in motor vehicle 1, the present disclosure is not limited to this configuration. For example, capacitive sensor apparatus 10 may be applied to electrical household appliances such as washing machines, various electrical equipments such as cameras, as well as personal computers, mobile phones, Personal Digital Assistants, handheld game machines, copy machines, and ticket machines, and in housing related equipment, doorknobs of front doors of houses, etc. Although capacitive sensor apparatus 10 may be provided on a part where an electrically conductive fluid, such as water, easily falls on, capacitive sensor apparatus 10 may be provided on a part where such a fluid less likely to fall on.

Although the above embodiment has described the configuration in which sensor element 12 (first and second electrodes 13 and 14) is disposed on substrate 11, the present disclosure is not limited to this configuration. For example, capacitive sensor apparatus 10 may have a configuration in which sensor element 12 is made of metal plates (first and second electrodes 13 and 14) without substrate 11 is directly attached to inner surface 3a of rear garnish 3.

Although the above embodiment has described the configuration in which the outlines of the first and second electrodes 13 and 14 and floating conductor 15 are oval, the present disclosure is not limited to this configuration. Specifically, the outlines of first and second electrodes 13 and 14 and floating conductor 15 may be of various shapes, such as a circle and a polygonal shape.

Although the above embodiment has described the configuration in which only one first electrode 13 is disposed, the present disclosure is not limited to this configuration. A plurality of first electrodes 13 may be disposed (not illustrated). Capacitive sensor apparatus 10 having such a configuration also provides similar effects as in the above embodiment, as long as floating conductor 15 overlaps each of first electrodes 13 in the projection view.

Although the embodiment has described the configuration in which floating conductor 15 includes a metal plate, the present disclosure is not limited to this configuration. For example, floating conductor 15 may be a member including a resin plate which is not illustrated, and the outer surface of the resin plate is metal plated. Alternatively, floating conductor 15 may be a member including a resin plate and a metal plate attached to the outer surface of the resin plate, which is not illustrated. Moreover, in order to protect floating conductor 15, floating conductor 15 may be a member having an outer surface covered with a resin, which is not illustrated. Such a configuration also provides similar effects as in the above embodiment, as long as floating conductor 15 is electrically conductive.

The above embodiment has described the configuration in which floating conductor 15 includes a flat metal plate as illustrated in FIGS. 2 and 8, but the present disclosure is not limited to this configuration. For example, floating conductor 15 may be shaped such that its cross section is curved. Such a configuration is also possible, as long as floating conductor 15 overlaps at least first electrode 13 in the projection view.

In the above embodiment, a part of floating conductor 15 may be inserted and fixed to a hole (not illustrated) passing from inner surface 3a of rear garnish 3 to outer surface 3b. Capacitive sensor apparatus 10 having such a configuration also achieves similar effects as in the above embodiment, as long as floating conductor 15 overlaps at least first electrode 13 in the projection view regardless of the presence of the hole.

Although the configuration in which controller 16 compares first calculated value ΔX with fourth calculated value (TH2×ΔZ) and compares first calculated value ΔX with fifth calculated value (TH3×ΔY) in Step S104 of the processing operation illustrated in FIG. 5 in the above embodiment, the present disclosure is not limited to this configuration. For example, Step S104 may be substituted by a step in which controller 16 compares, with second threshold TH2, the value obtained by dividing the first calculated value ΔX by third calculated value ΔZ, and compares, with third threshold TH3, the value obtained by dividing first calculated value ΔX by second calculated value ΔY. Similarly, Step S109 may be substituted by a step in which controller 16 compares, with fifth threshold TH5, the value obtained by dividing the first calculated value ΔX by third calculated value ΔZ, and compares, with sixth threshold TH6, the value obtained by dividing first calculated value ΔX by second calculated value ΔY.

While an embodiment has been described herein above, it is to be appreciated that various changes in form and detail may be made without departing from the spirit and scope of the present disclosure as presently or hereafter claimed.

Further Information about Technical Background to this Application

The disclosures of the following Japanese Patent Applications including specification, drawings and claims are incorporated herein by references on their entirety: Japanese Patent Application No. 2018-030363 filed on Feb. 23, 2018 and Japanese Patent Application No. 2018-178972 filed on Sep. 25, 2018.

INDUSTRIAL APPLICABILITY

The present disclosure is industrially applicable to a capacitive sensor apparatus provided in a motor vehicle, etc.

What is claimed is:

1. A capacitive sensor apparatus that is attached to a mounting member having a first surface and a second surface opposite the first surface, and configured to receive a contact operation toward the second surface performed by an operation body, the capacitive sensor apparatus comprising:
   a sensor element disposed on the first surface of the mounting member;
   a floating conductor that is disposed on the second surface of the mounting member and is electrically conductive, the floating conductor being electrically disconnected from the sensor element and a ground; and
   a holding part that provides a space between the first surface of the mounting member and the sensor element, wherein
   the sensor element includes:
      a first electrode; and
      a second electrode in a shape of a ring surrounding an outer periphery of the first electrode and being electrically disconnected from the first electrode, and
   the floating conductor overlaps at least the first electrode in a projection view seen from the first surface, wherein
   the floating conductor is formed such that the floating conductor at least partially overlaps the first electrode and partially overlaps the second electrode in the projection view, and
   the outer periphery of the floating conductor is positioned closer to a central portion of the capacitive sensor apparatus than an outer periphery of the second electrode in the projection view and at least a part of the outer periphery of the floating conductor is positioned farther from the central portion of the capacitive sensor apparatus than an inner periphery of the second electrode in the projection view.

2. The capacitive sensor apparatus according to claim 1, wherein
   a surface area of the floating conductor is larger than an area that comes into contact with the operation body.

3. The capacitive sensor apparatus according to claim 1, wherein
   a surface of the floating conductor is covered with a resin.

4. The capacitive sensor apparatus according to claim 1, wherein
   the capacitive sensor apparatus is configured to receive a proximity operation toward the second surface performed by the operation body, the proximity operation being an operation that brings the operation body into proximity with the floating conductor, and
   the capacitive sensor apparatus further comprising a controller that is electrically connected to the first electrode and the second electrode, wherein
   the controller is configured to perform:
      a first measurement in which the controller scans both the first electrode and the second electrode;
      a second measurement in which the controller scans only the first electrode with the second electrode being connected to a ground; and
      a third measurement in which the controller scans only the second electrode with the first electrode being connected to the ground, and
   the controller detects measured values of capacitance of the sensor element by performing the first measurement, the second measurement, and the third measurement, and determines whether an operation performed by the operation body is the proximity operation or the contact operation, based on amounts of change in the measured values of the capacitance of the sensor element.

5. The capacitive sensor apparatus according to claim 1, wherein the holding part is arranged on the first surface.

6. The capacitive sensor apparatus according to claim 5, wherein
the holding part provides the space between (i) the first surface of the mounting member opposite the second surface on which the floating conductor at least partially overlaps the part of the first electrode and partially overlaps the second electrode in the projection view and (ii) the second electrode being electrically disconnected from the first electrode.

\* \* \* \* \*